US012562447B2

(12) United States Patent
Gunnarsson et al.

(10) Patent No.: US 12,562,447 B2
(45) Date of Patent: Feb. 24, 2026

(54) COMPACT BALUN WITH OUT-OF-BAND SPURIOUS SUPPRESSION

(71) Applicant: SAAB AB, Linköping (SE)

(72) Inventors: Sten Gunnarsson, Järfälla (SE); Dan Kuylenstierna, Öjersjö (SE)

(73) Assignee: SAAB AB, Linköping (SE)

( * ) Notice: Subject to any disclaimer, the term of this patent is extended or adjusted under 35 U.S.C. 154(b) by 201 days.

(21) Appl. No.: 18/262,260

(22) PCT Filed: Jan. 12, 2022

(86) PCT No.: PCT/SE2022/050018
§ 371 (c)(1),
(2) Date: Jul. 20, 2023

(87) PCT Pub. No.: WO2022/159016
PCT Pub. Date: Jul. 28, 2022

(65) Prior Publication Data

US 2024/0072405 A1 Feb. 29, 2024

(30) Foreign Application Priority Data

Jan. 21, 2021 (SE) .................................... 2100010-4

(51) Int. Cl.
*H01P 5/10* (2006.01)
*H01P 5/12* (2006.01)
*H03H 7/42* (2006.01)

(52) U.S. Cl.
CPC .................. *H01P 5/10* (2013.01); *H01P 5/12* (2013.01); *H03H 7/422* (2013.01)

(58) Field of Classification Search
CPC .. H01P 5/10; H01P 5/12; H03H 7/422; H03H 7/42; H04B 1/0458; H04B 1/18
See application file for complete search history.

(56) References Cited

U.S. PATENT DOCUMENTS 7,557,673 B1 7/2009 Meharry
10,505,243 B2 12/2019 Suzuki et al.
(Continued)

FOREIGN PATENT DOCUMENTS

CN 108574471 A 9/2018
CN 110784179 A 2/2020
(Continued)

OTHER PUBLICATIONS

International Search Report and Written Opinion mailed Feb. 21, 2022 for International Application No. PCT/SE2022/050018, 13 pages.
(Continued)

*Primary Examiner* — Andrea Lindgren Baltzell
*Assistant Examiner* — Kimberly E Glenn
(74) *Attorney, Agent, or Firm* — Sage Patent Group

(57) ABSTRACT

A balun circuit is disclosed. The balun circuit has an unbalanced port and a balanced port, wherein the balanced port comprises a first terminal, and a second terminal. The balun circuit further comprises a main line having a first end and a second end, the first end being coupled to the unbalanced port. Moreover, the balun circuit comprises a first sub-line electromagnetically coupled to the main line, the first sub-line having a first end and a second end, wherein the first end of the first sub-line is coupled to the first terminal of the balanced port. The balun circuit further comprises a second sub-line electromagnetically coupled to the main line, the second sub-line having a first end and a second end, wherein the first end of the second sub-line is coupled to the second terminal of the balanced port.

10 Claims, 6 Drawing Sheets

(56) References Cited

U.S. PATENT DOCUMENTS

| | | | | |
|---|---|---|---|---|
| 2002/0171508 | A1* | 11/2002 | Harada | H03H 7/463 333/133 |
| 2002/0171529 | A1 | 11/2002 | Tang | |
| 2004/0164817 | A1* | 8/2004 | Nosaka | H01P 5/10 333/25 |
| 2006/0066415 | A1 | 3/2006 | Weng et al. | |
| 2010/0194493 | A1 | 8/2010 | Thompson | |
| 2010/0231316 | A1 | 9/2010 | Jiang | |
| 2019/0348974 | A1* | 11/2019 | Bao | H03H 7/0115 |
| 2020/0119692 | A1* | 4/2020 | Inagaki | H03D 7/14 |

FOREIGN PATENT DOCUMENTS

| | | | |
|---|---|---|---|
| EP | 1538746 | A2 | 6/2005 |
| JP | 2002217670 | A | 8/2002 |
| JP | 2004304615 | A | 10/2004 |
| WO | 2010104602 | A1 | 9/2010 |

OTHER PUBLICATIONS

International Preliminary Report on Patentability mailed Nov. 29, 2022 for International Application No. PCT/SE2022/050018, 12 pages.
Extended European Search Report mailed Nov. 20, 2024 for European Patent Application No. 22742948.7, 8 pages.

* cited by examiner

COMPACT BALUN WITH OUT-OF-BAND SPURIOUS SUPPRESSION

CROSS-REFERENCE TO RELATED APPLICATIONS

This application is a 35 U.S.C. § 371 national stage application for International Application No. PCT/SE2022/050018, entitled "COMPACT BALUN WITH OUT-OF-BAND SPURIOUS SUPPRESSION", filed on Jan. 12, 2022, which claims priority to Swedish Patent Application No. 2100010-4, filed on Jan. 21, 2021, the disclosures and contents of which are hereby incorporated by reference in their entireties.

TECHNICAL FIELD

The present invention relates to the field of microwave engineering, and in particular to a balun (BALanced to/from UN balanced) for use in e.g. Monolithic Microwave Integrated Circuit (MMIC) and Printed Circuit Board (PCB) based microwave modules such as for example frequency multipliers, mixers, amplifiers, antenna arrangements, etc.

BACKGROUND

A balun is a fundamental building block in many microwave systems, and a substantial portion of microwave hardware contains one or several baluns. In its simplest form, a balun transforms a single-ended signal (i.e. unbalanced signal) to a differential signal (i.e. a balanced signal) or vice versa. This makes the balun a key component in for example many antenna systems where the antenna element in itself is a differential structure while the microwave electronics provide single-ended signals. Baluns are also frequently used for impedance transformation, i.e. matching, and/or as out-phasing power splitters/combiners for enhanced suppression of in-band unwanted spuriouses/harmonics.

The suppression of spuriouses (i.e. RF emission not deliberately created or transmitted) is particularly important in wideband applications. A known issue in currently known balun topologies is the finite (and often insufficient) suppression of out-of-band spuriouses, e.g. harmonics of the input signal occurring outside (both below and above) the passband of the balun. It should be noted that spurious emissions may include harmonic emissions, parasitic emissions, intermodulation products and/or frequency conversion products.

Furthermore, this out-of-band suppression is not part of the conventional balun design work, wherefore the suppression will de facto "become what it becomes" depending on the chosen technology and e.g. parasitics in the circuit. The issue with finite and non-defined suppression of spuriouses is traditionally solved by cascading the balun with one or several filters that remove residual harmonics on the balun output. However, such solutions tend to be bulky and furthermore add significant cost to the system. The added costs arise from the fact that the one or more filters typically occupy a large space when implemented in MMIC or PCB technologies and cost associated with planar technologies is directly proportional to the area used.

There is accordingly a need for new and improved balun topologies that provide improved out-of-band spurious suppression without impairing the performance of the balun itself. As always, the improvement in performance shall preferably be made without significant impact on the size, power consumption and cost of the circuit.

SUMMARY

It is therefore an object of the present invention to provide a balun circuit that alleviates all or at least some of the above described deficiencies of presently known solutions.

This object is achieved by means of a balun circuit as defined in the appended claims. The term exemplary is in the present context to be understood as serving as an instance, example or illustration.

According to a first aspect of the present invention, there is provided a balun circuit comprising an unbalanced port and a balanced port. The balanced port comprises a first terminal, and a second terminal. The balun circuit further comprises a main line having a first end and a second end, where the first end is coupled to the unbalanced port. Moreover, the balun circuit comprises a first sub-line electromagnetically coupled to the main line, the first sub-line having a first end and a second end, wherein the first end of the first sub-line is coupled to the first terminal of the balanced port. The balun circuit further comprises a second sub-line electromagnetically coupled to the main line, the second sub-line having a first end and a second end, wherein the first end of the second sub-line is coupled to the second terminal of the balanced port. Furthermore, the balun circuit comprises a series resonant circuit connected between the first terminal and the second terminal.

The provided balun circuit can be realized in a compact and space-efficient manner with inherent and predetermined suppression of specific out-of-band spurious signals, thereby significantly reducing (or even completely removing) the need for separate filter structures. The herein proposed balun circuit may accordingly reduce the size and cost as compared to conventional solutions utilizing separate balun and filter structures. Moreover, the balun circuit is particularly suitable for high frequency applications, such as in generation of microwave signals using frequency multipliers from low to high frequencies, where spurious suppression is particularly desirable.

In accordance with some embodiments, the series resonant circuit is a lumped element series resonant circuit comprising an inductive element and a capacitive element connected in series.

According to a second aspect of the present invention, there is provided an antenna arrangement for transmitting and/or receiving electromagnetic signals. The antenna arrangement comprises at least one antenna element and at least one electronics module for transmitting and/or receiving signals to/from the at least one antenna element. The electronics module comprises a balun circuit according to any one of the embodiments disclosed herein. With this aspect of the invention, similar advantages and preferred features are present as in the previously discussed first aspect of the invention.

In accordance with some aspects, there is provided a frequency mixer comprising at least one balun circuit according to any one of the embodiments disclosed herein.

In accordance with some aspects, there is provided a frequency multiplier for generating an output signal whose output frequency is a harmonic of its input frequency, wherein the frequency multiplier comprises a balun circuit according to any one of the embodiments disclosed herein.

Further embodiments of the invention are defined in the dependent claims. It should be emphasized that the term "comprises/comprising" when used in this specification is taken to specify the presence of stated features, integers, steps, or components. It does not preclude the presence or addition of one or more other features, integers, steps, components, or groups thereof.

These and other features and advantages of the present invention will in the following be further clarified with reference to the embodiments described hereinafter.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
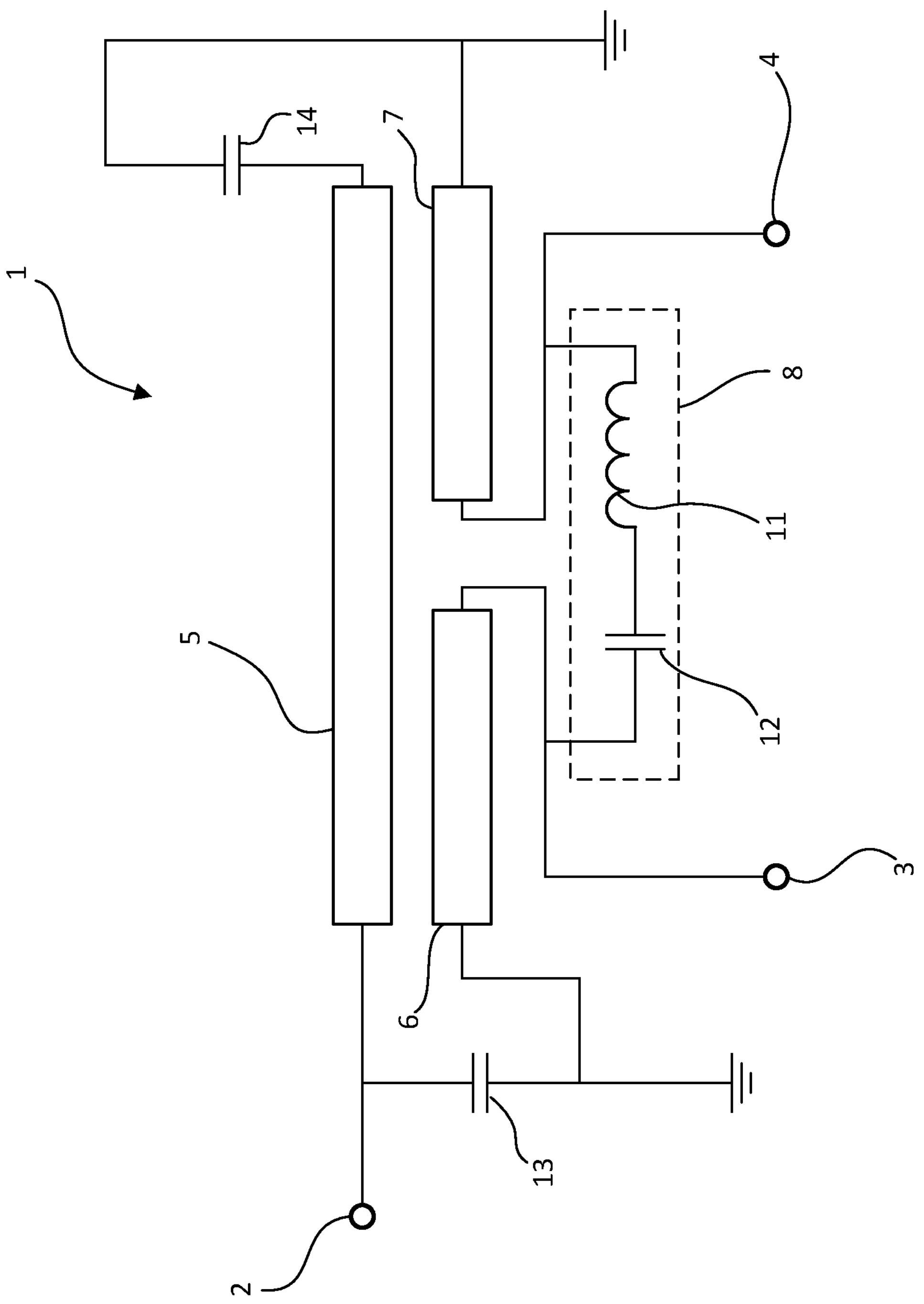
FIG. 1 is a schematic representation of a balun in accordance with an embodiment of the present invention.

In the following detailed description, some embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention. In the following description of exemplary embodiments, the same reference numerals denote the same or similar components.

FIG. 1 is a schematic circuit representation of a balun circuit 1 in accordance with an embodiment of the invention. The balun 1 is suitable for transforming a single-ended signal (i.e. unbalanced signal) provided at the unbalanced port 2 to a differential signal (i.e. a balanced signal) provided at the unbalanced port or vice versa. Accordingly, the balun circuit 1 has an unbalanced port 2 and a balanced port, where the balanced port has a first terminal 3 and a second terminal 4.

Furthermore, the balun 1 has a main line 5 with a first end and a second end, where the first end is coupled to the unbalanced port 2. The balun 1 also has a first sub-line 6 and a second sub-line that are electromagnetically coupled to the main line 5. The first sub-line 6 has a first end and a second end, where the first end is coupled to the first terminal 3 of the balanced port. The second sub-line 7 has a first end and a second end, where the first end of the second sub-line 7 is coupled to the second terminal 4 of the balanced port.

The balun circuit 1 further has a series resonant circuit 8 connected between the first terminal 3 of the balanced port and the second terminal 4 of the balanced port. Moreover, the balun circuit 1 comprises a two shunt capacitors 13, 14 connected to the first and seconds ends of the main line 5.

The setup with the main line and the two sub-lines originates from the distributed Marchand balun, which is a very common balun design in planar technologies. In its ideal form, the Marchand balun consists of two λ/4 coupled lines where the odd mode and even mode impedances determine the input/output impedances the power division ratio. Moreover, a simulations of the electrical behaviour of the distributed Marchand balun with ideal components will show ideal transmission and reflection at the fundamental frequency (i.e. center frequency of the balun) and for all odd harmonics. In reality however, the performance is less than ideal at higher frequencies (i.e. more loss at higher frequencies), but still several passbands and accordingly, significant leakage, is found on all odd harmonics in practical realizations of the distributed Marchand balun.

The distributed Marchand balun is conventionally only used for high frequency operation since the λ/4 coupled lines become too bulky (and therefore too expensive) to implement at lower frequencies. For that reason, lumped variants of the Marchand balun were introduced. The lumped Marchand balun will occupy significantly less area in planar technologies since it is based on lumped capacitors and inductors rather than distributed transmission lines.

Simulations of the electrical behaviour of the lumped Marchand balun with ideal lumped components will show that the high frequency leakage is almost completely suppressed. However, there is generally a substantial leakage at the second harmonic, which may cause problems when the balun is used in e.g. multiplier applications. In an actual realization, with commercial components, the lumped Marchand balun will exhibit significant out-of-band leakage also at higher frequencies due to the presence of component parasitics. Analytical expressions for the shunt capacitors ($C_s$), the coupling capacitors ($C_c$) and the inductors ($L/L_s$) are for example provided in "Analysis and Design of Lumped Element Marchand Baluns" by T. Johansen and V. Krozer (MIKON 2008-17$^{th}$ International Conference on Microwaves, Radar and Wireless Communications) and are, for the sake of completeness, reiterated in Eq. (1) below.

$$L_s = \frac{Z_{0e} + Z_{0o}}{2\omega} \tag{1}$$

$$k = \frac{Z_{0e} + Z_{0o}}{2\omega L_s},\ C_{s1} = C_{s2} = C_s = \frac{1}{\omega Z_{0e}},\ C_c = \frac{1}{2\omega Z_{0o}} - 0.5C_s$$

However, in some applications, neither the distributed nor the lumped implementations of the Marchand balun may be feasible. For such cases, the semi-lumped Marchand baluns were introduced, where distributed coupled lines are employed as in the original all-distributed Marchand balun, but with shunt capacitors at the open line ends so to emulate electrically long lines although the physical size might be significantly shorter compared to the original length of λ/4. Semi-lumped Marchand baluns typically possess a leakage of high-frequency out-of-band signals somewhere in between that of the all-distributed Marchand balun and the lumped Marchand balun.

Thus, the present inventors realized that in order to mitigate these deficiencies with the known balun solutions, one can replace the two shunt capacitors of the differential output with an N:th order series resonator employing N resonances. Due to the nature of the resonator, spuriouses on the resonant frequencies will be effectively cancelled/short-circuited. In more detail, it was realized that the shunt capacitors on the differential output will be effectively seen as series-connected from the perspective of the differential output signal. Series-connected capacitors of equal value will resemble a capacitor with half the original value of one of the capacitors.

Further, in the design of the series resonator 8, care may be taken that the equivalent capacitor as seen in parallel with the differential output will provide the same effective total capacitance at the fundamental frequency as determined by the design of a semi-lumped Marchand balun. In other words, by replacing the discrete capacitors found on the differential output on a conventional circuit with a series resonant circuit that resembles the nominal capacitance at the operating frequency, one can achieve efficient filtering of the out-of-band spuriouses. Thus, the herein suggested approach replaces the intrinsic capacitors in the balun circuit, and does not merely cascade different functions, as is conventionally done. Accordingly, FIG. 1 illustrates a balun circuit in accordance with an embodiment of the invention, where the series resonator 8 on the differential output has an inductive element 11 and a capacitive element 12 connected in series.

Figure 3:
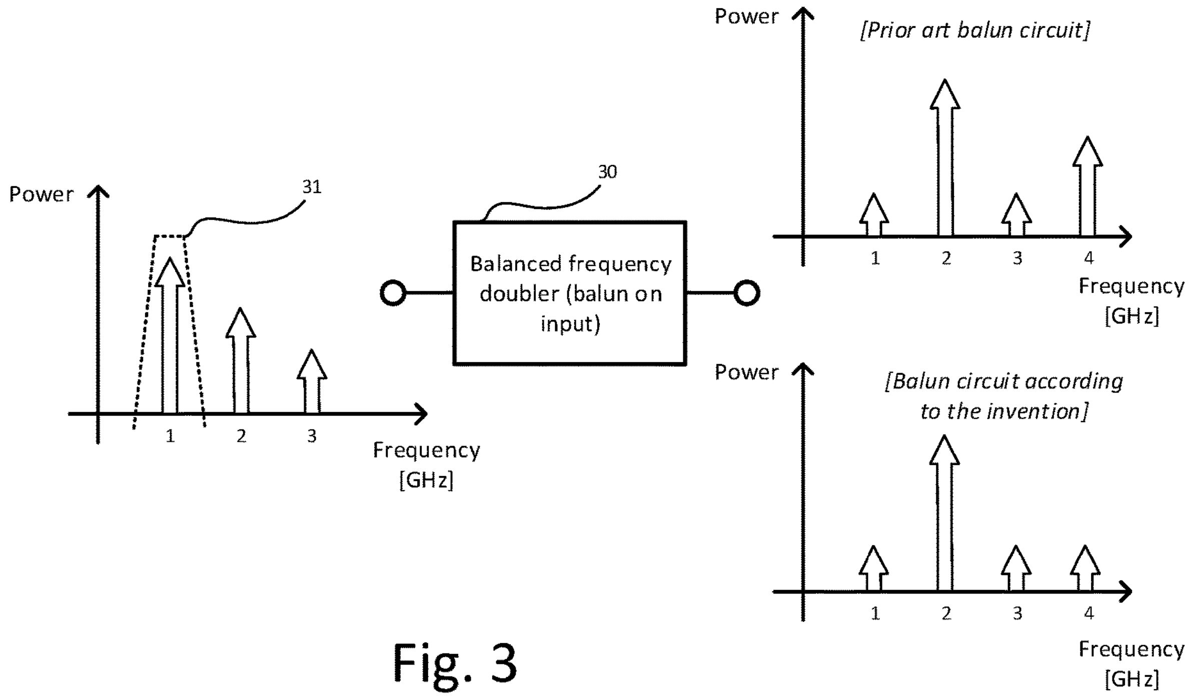
FIG. 3 is a schematic illustration showing a performance comparison between a balun circuit in accordance with an embodiment of the present invention in a frequency multiplier application and a conventional balun.

Turning briefly to FIG. 3, which illustrates a performance comparison between a balun circuit in accordance with an embodiment of the present invention and a conventional balun circuit. In more detail, FIG. 3 illustrates a schematic block representation of a balanced frequency doubler 30, with schematic graphs indicative of the input that is fed to the frequency doubler 30, the passband of the balun 31, and the corresponding outputs. Ideally, a frequency doubler is only fed with a single tone, in the illustrated example, this tone is located at 1 GHz. However, in reality, the input spectrum will almost always contain harmonics of the input signal (2, 3, 4, . . . GHz). With conventional baluns, the output of the balanced doubler 30 may have good suppression of the fundamental and third order tones due to the nature of the design. However, there will be significant leakage of the $4^{th}$ order tone which will distort the output spectrum severely and in extension, corrupt the operation of the overall system. However, with the balun circuit as presented herein, the unwanted $2^{nd}$ order input tone will effectively be rejected in the balun itself and the output spectrum will resemble a more ideal signal source, providing a better system performance and less spuriouses in the overall system.

Reverting back to FIG. 1, analytical expressions for the capacitance of the capacitive element ($C_n$) 12 and the inductance of the inductive element ($L_n$) 11 may in accordance with some embodiments be derived from Eq. (2) and Eq. (3) below. The capacitance $C_s$ in Eq. (2) and Eq. (3) is from Eq. (1) above.

$$C_s = 2\frac{C_n}{1-w_0^2 L_n C_n} = \left\{ n\omega_0 = \frac{1}{\sqrt{L_n C_n}} \right\} = 2\frac{n^2}{n^2-1}C_n \rightarrow C_n = \frac{1}{2}\frac{n^2-1}{n^2}C_s \tag{2}$$

$$L_n = \frac{2}{n^2\omega_0^2 C_n} = \frac{2}{(n^2-1)\omega_0^2 C_S} \tag{3}$$

Here, $\omega_0$ denotes the centre frequency for the balun and $n\omega_0$ will then depict the frequency that will be suppressed. Note that n does not need to be an integer but can be any positive real number.

Figure 4:
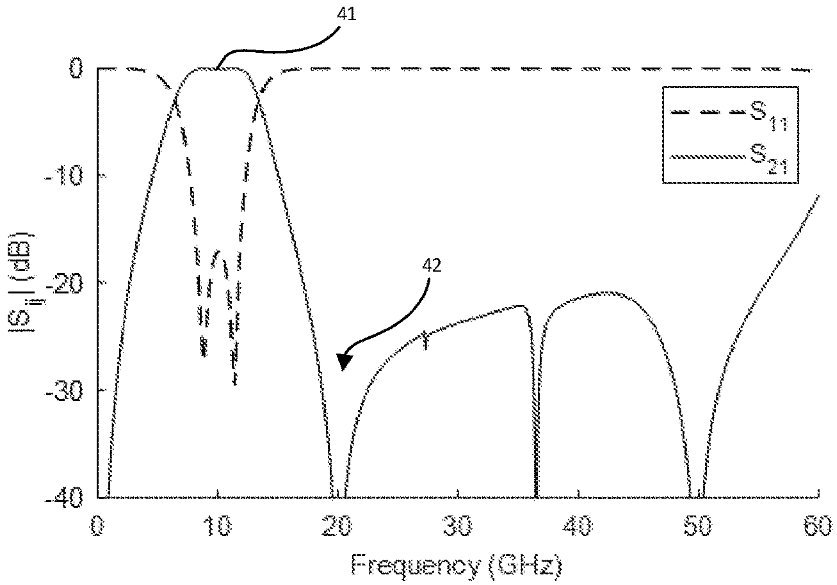
FIG. 4 is a graph illustrating a simulation of the output as a function of frequency in terms of two-port S-parameters of a balun circuit in accordance with an embodiment of the present invention.

Simulations of the performance of the balun circuit depicted in FIG. 1 is illustrated in the graph of FIG. 4, which indicates the transmission and reflection coefficients from 0 to 60 GHz. Here, the centre frequency of the balun is set to 10 GHz and the coefficient n from Eq. (2) and (3) is set to two, wherefore suppression of signals at 20 GHz is obtained. It should be noted that in some embodiments, higher order resonators with multiple resonances are used. Thereby, several frequencies may be short-circuited (and therefore suppressed) simultaneously. Moreover, the resonance frequencies may be below and/or above the passband of the balun circuit.

Thus, in accordance with some embodiments, the balun circuit 1 is configured to operate at a frequency band having a centre frequency ($f_0=\omega_0/2\pi$), and the series resonant circuit 8 is configured to have a resonance frequency above or below the centre frequency ($f_0$) of the balun circuit. Moreover, the series resonant circuit may be configured to have one or more resonance frequencies at $0.25f_0$, $0.5f_0$, $2f_0$, $3f_0$, and/or $4f_0$.

Figure 2:
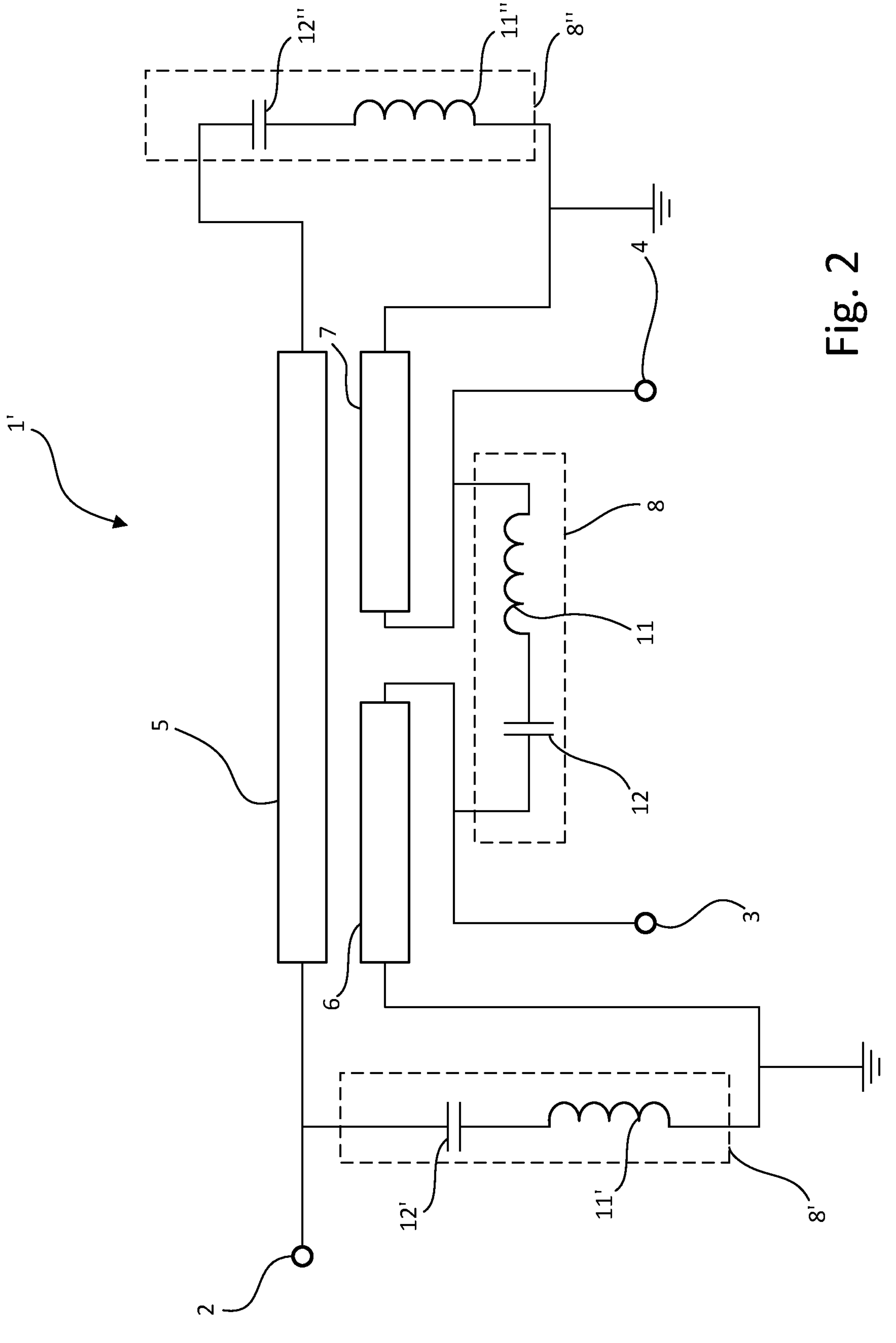
FIG. 2 is a schematic representation of a balun in accordance with an embodiment of the present invention.

FIG. 2 illustrates a schematic representation of a balun circuit 1' in accordance with another embodiment of the present invention. Here, the remaining "end capacitors" (ref. 13 and 14 in FIG. 1) have also been replaced with series resonant circuits 8', 8" in order to enable for even higher suppression at higher frequencies. The remaining components of the balun circuit 1' are analogous, as for the balun circuit 1 illustrated in FIG. 1, and will for the sake of brevity and conciseness not be repeated. Each series resonant circuit 8, 8', 8" is an N:th order series resonator employing N resonances, where N is an integer 1.

In more detail, the balun circuit 1' comprises a second series resonant circuit 8' connected between the first end of the main line 5 and ground, and a third series resonant circuit 8" connected between the second end of the main line 5 and ground. Here, the series resonant circuits 8, 8', 8" are illustrated as first order resonant circuits, one or more of these may be of a higher order, as already mentioned in the foregoing. In more detail, each of the second series resonant circuit 8' and third series resonant circuit 8" is a lumped element series resonant circuit comprising an inductive element 11', 11" and a capacitive element 12', 12" connected in series.

In accordance with some embodiments, the values of the capacitive elements ($C_{nn}$) 12', 12", and the inductive elements ($L_{nn}$) 11', 11" of the series resonant circuits 8', 8" are given by the Eq. (4) and Eq. (5) below, where $C_c$ is given by Eq. (1).

$$C_c = \frac{C_{nn}}{1 - w_0^2 L_{nn} C_{nn}} = \left\{ n\omega_0 = \frac{1}{\sqrt{L_{nn} C_{nn}}} \right\} = \frac{n^2}{n^2 - 1} C_{nn} \to C_{nn} = \frac{n^2 - 1}{n^2} C_c \quad (4)$$

$$L_{nn} = \frac{2}{n^2 \omega_0^2 C_{nn}} = \frac{2}{(n^2 - 1)\omega_0^2 C_c} \quad (5)$$

As before, $\omega_0$ denotes the centre frequency for the balun and $n\omega_0$ will then depict the frequency that will be suppressed, and n does not need to be an integer but can be any positive real number.

Furthermore, in accordance with some embodiments, each series resonant circuit 8, 8', 8" has a resonance frequency that is tuned to suppress spurious signals outside of the balun circuit's passband (ref. 31 in FIG. 3). Each series resonant circuit 8, 8', 8" may be further tuned to present an equivalent capacitance for impedance matching and coupling within the passband of the balun circuit 1'. Moreover, each series resonant circuit 8, 8', 8" may have a resonance frequency that is different compared to the other series resonant circuits. However, in some embodiments, the resonance frequencies of the series resonant circuits 8, 8', 8" may be the same for one or more of the series resonant circuits 8, 8', 8".

Figure 5A:
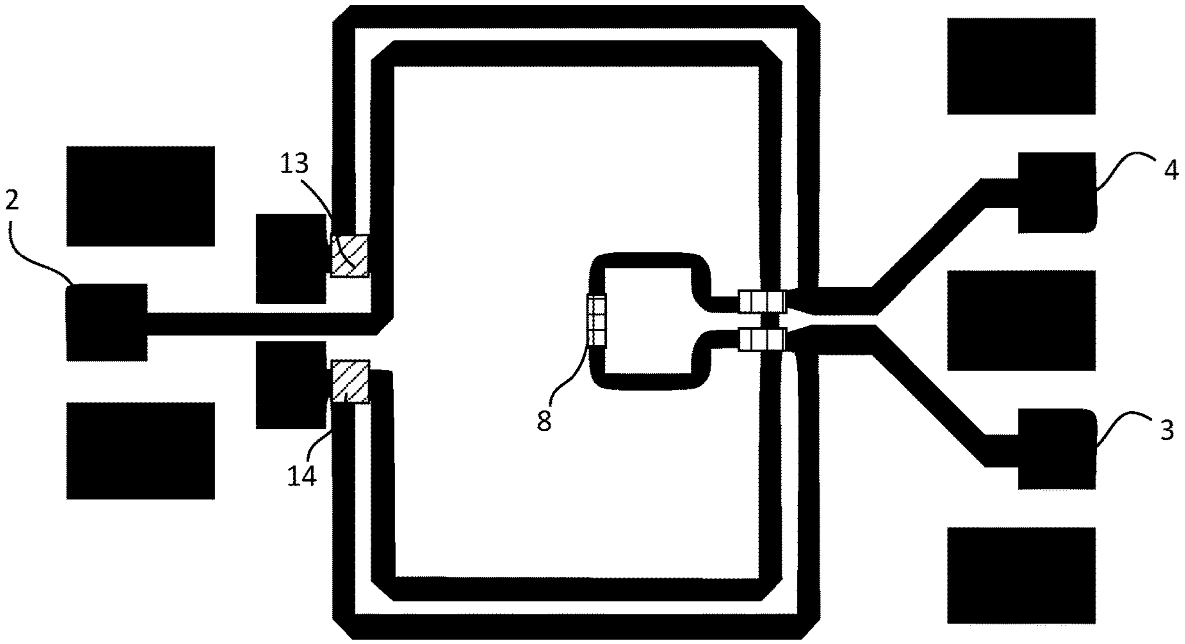
FIG. 5*a* is a Monolithic Microwave Integrated Circuit (MMIC) implementation of the balun circuit illustrated in FIG. 1 in accordance with an embodiment of the present invention.
Figure 5B:
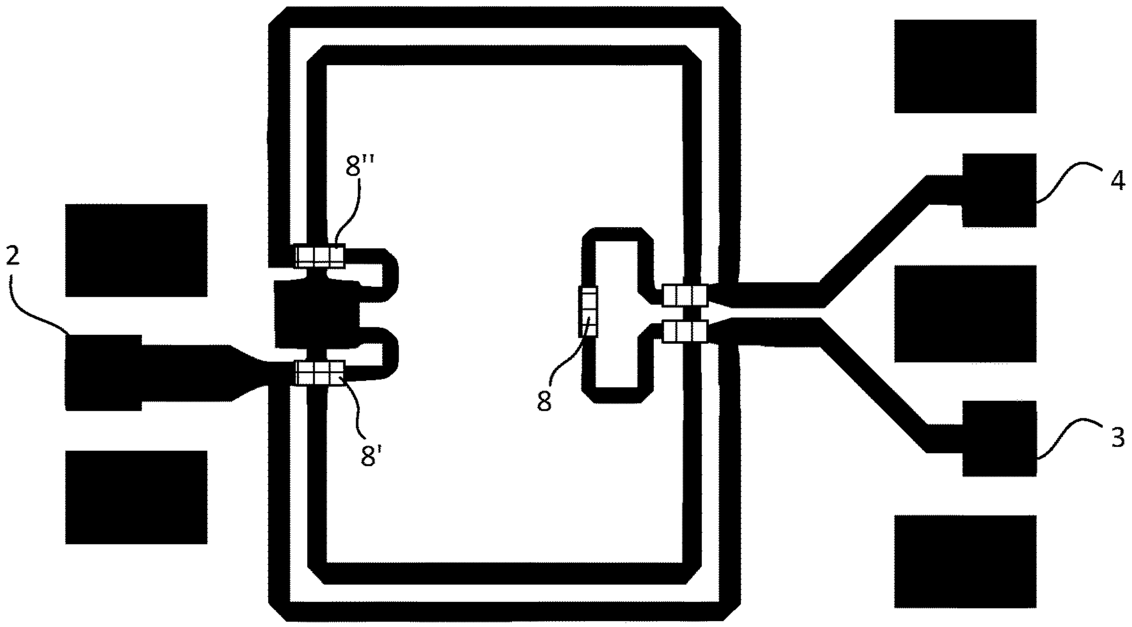
FIG. 5*b* is a Monolithic Microwave Integrated Circuit (MMIC) implementation of the balun circuit illustrated in FIG. 2 in accordance with an embodiment of the present invention.

As briefly mentioned, the herein proposed balun circuit 1, 1" is suitable for any planar technology. However, the general idea is also transferable to other, non-planar technologies. FIGS. 5*a* and 5*b* illustrate MMIC implementations of the balun circuits from FIGS. 1 and 2, respectively. Both of the circuits illustrated in FIGS. 5*a*, and 5*b* comprise a first order series resonator 8 in parallel with the balanced output (terminals 3 and 4 are indicated at the right end of each figure). The resonator provided at the balanced output is designed to suppress the $2^{nd}$ harmonic of the input centre frequency (in accordance with Equations 2 and 3). Moreover, the example of a MMIC layout of FIG. 5*b* has additional first order resonators 8', 8" designed to suppress the $3^{rd}$ order harmonic of the input centre frequency (in accordance with Equations 4 and 5). Thus, the balun circuit 1, 1" as described herein can be implemented in planar technologies with as few as two metal layers.

Figure 6A:
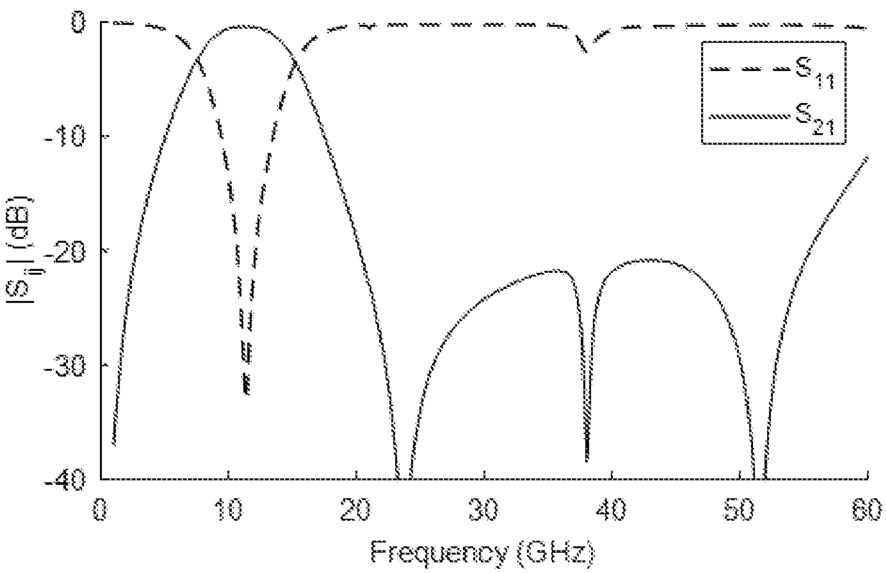
FIG. 6*a* is a graph illustrating a simulation of the output as a function of frequency in terms of two-port S-parameters of the balun circuit illustrated in FIG. 5*a*.
Figure 6B:
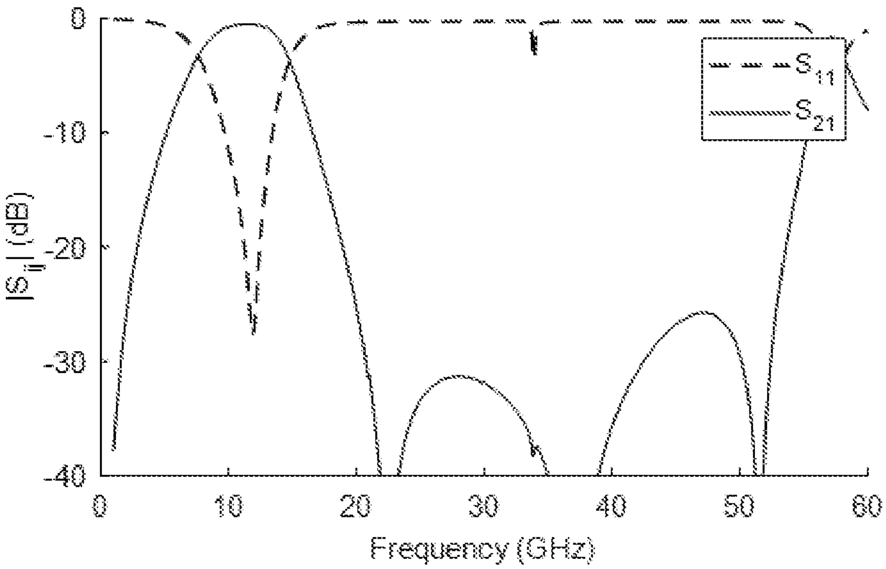
FIG. 6*b* is a graph illustrating a simulation of the output as a function of frequency in terms of two-port S-parameters of the balun circuit illustrated in FIG. 5*b*.

The S-parameter simulations ($S_{11}$ and $S_{21}$) of the MMIC implementations depicted in FIGS. 5*a*, and 5*b* are provided in FIGS. 6*a* and 6*b*, respectively. In FIG. 6*a*, the centre frequency of the balun is at 12 GHz, and suppression at 24 GHz is achieved. In FIG. 6*b*, the centre frequency of the balun is at 11.2 GHz, and suppression at 22.4 GHz, as well as at 33.6 GHz is achieved. In particular, one can observe the effect of having several resonances at several frequencies in order to achieve a wideband spurious suppression by comparing the simulation result of FIG. 6*a* with the simulation results of FIG. 6*b*.

Figure 7:
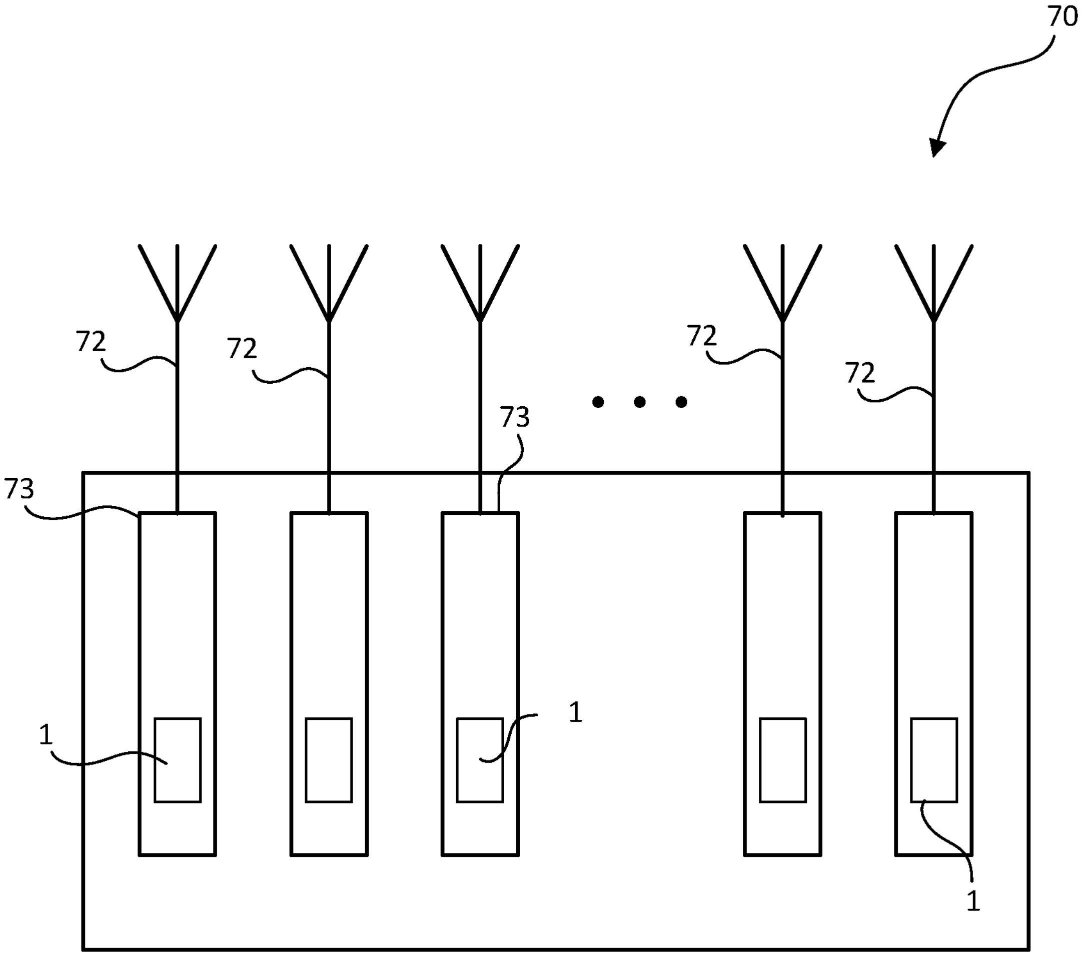
FIG. 7 is a schematic block diagram representation of an antenna arrangement comprising a balun circuit in accordance with an embodiment of the present invention.

FIG. 7 shows a block diagram representation of an antenna arrangement for transmitting and/or receiving electromagnetic signals in accordance with an embodiment of the present disclosure. The antenna arrangement has a set of antenna elements 72 and each antenna element 72 is connected to an electronics module 73 for transmitting and/or receiving signals to/from the corresponding antenna element 72. Moreover, each electronics module 73 has a balun circuit 1 in accordance with any one of the embodiments disclosed herein. Thus, FIG. 7 is an example of a system implementation of the balun circuit as proposed herein.

However, as the skilled person readily understands, this is merely one out of several possible "system" implementations for the balun circuit described herein. Thus, in some embodiments there is provided an MMIC-based or PCB-based microwave module comprising a balun circuit in accordance with any one of the embodiments disclosed herein. In general, the methodology of providing a series resonant circuit in parallel with a differential output is applicable for any differential circuit. Thus, in some aspects, there is provided a differential circuit comprising an unbalanced port and a balanced port, where the balanced port comprises a first terminal, and a second terminal. Moreover, the differential circuit comprises a series resonant circuit connected between the first terminal and the second terminal. With this aspect of the invention, similar advantages and preferred features are present as in the previously discussed aspects of the invention.

Further, in some embodiments there is provided a balanced frequency mixer comprising at least one balun circuit according to any one of the embodiments disclosed herein. In some embodiments, there is provided a frequency multiplier for generating an output signal whose output frequency is a harmonic (multiple) of its input frequency, where the frequency multiplier comprises a balun circuit in accordance with any one of the embodiments disclosed herein.

It should be noted that the word "comprising" does not exclude the presence of other elements or steps than those listed and the words "a" or "an" preceding an element do not exclude the presence of a plurality of such elements. The above mentioned and described embodiments are only given as examples and should not be limiting to the present invention. Other solutions, uses, objectives, and functions within the scope of the invention as claimed in the below described patent embodiments should be apparent for the person skilled in the art.

The invention claimed is:

1. A balun circuit comprising:

an unbalanced port and a balanced port, wherein the balanced port comprises a first terminal, and a second terminal;

a main line having a first end and a second end, the first end being coupled to the unbalanced port;

a first sub-line electromagnetically coupled to the main line, the first sub-line having a first end and a second end, wherein the first end of the first sub-line is coupled to the first terminal of the balanced port;

a second sub-line electromagnetically coupled to the main line, the second sub-line having a first end and a second end, wherein the first end of the second sub-line is coupled to the second terminal of the balanced port;

a first series resonant circuit connected between the first terminal and the second terminal;

a second series resonant circuit connected between the first end of the main line and ground;

a third series resonant circuit connected between the second end of the main line and ground; and wherein each series resonant circuit has a resonance frequency that is tuned to suppress spurious signals outside of a passband of the balun circuit.

2. The balun circuit according to claim 1, wherein each series resonant circuit is a lumped element series resonant circuit comprising an inductive element and a capacitive element connected in series.

3. The balun circuit according to claim 1, wherein the balun circuit is configured to operate at a frequency band having a center frequency ($f_0$), and wherein each series resonant circuit is configured to have a resonance frequency above or below the center frequency ($f_0$) of the balun circuit.

4. The balun circuit according to claim 3, wherein each series resonant circuit is configured to have one or more resonance frequencies at $0.25f_0$, $0.5f_0$, $2f_0$, $3f_0$, and/or $4f_0$.

5. The balun circuit according to claim 1, wherein each series resonant circuit has a resonance frequency that is different compared to the other series resonant circuits.

6. The balun circuit according to claim 1, wherein each series resonant circuit has a resonance frequency that is tuned to present an equivalent capacitance for impedance matching and coupling within the passband of the balun circuit.

7. The balun circuit according to claim 1, wherein each series resonant circuit is an N:th order series resonator employing N resonances, N being an integer ≥1.

8. An antenna arrangement for transmitting and/or receiving electromagnetic signals, the antenna arrangement comprising:

at least one antenna element and at least one electronics module for transmitting and/or receiving signals to/from the at least one antenna element;

wherein the electronics module comprises a balun circuit according to claim 1.

9. A frequency mixer comprising at least one balun circuit according to claim 1.

10. A frequency multiplier for generating an output signal whose output frequency is a harmonic of its input frequency, wherein the frequency multiplier comprises a balun circuit according to claim 1.

* * * * *